(12) United States Patent
Lee et al.

(10) Patent No.: US 8,921,185 B2
(45) Date of Patent: Dec. 30, 2014

(54) METHOD FOR FABRICATING INTEGRATED CIRCUIT WITH DIFFERENT GATE HEIGHTS AND DIFFERENT MATERIALS

(71) Applicant: United Microelectronics Corporation, Hsinchu (TW)

(72) Inventors: Hsiang-Chen Lee, Kaohsiung (TW); Ping-Chia Shih, Tainan (TW); Ke-Chi Chen, Taoyuan County (TW); Chih-Ming Wang, Tainan (TW); Chi-Cheng Huang, Kaohsiung (TW)

(73) Assignee: United Microelectronics Corporation, Hsinchu (TW)

( * ) Notice: Subject to any disclaimer, the term of this patent is extended or adjusted under 35 U.S.C. 154(b) by 0 days.

(21) Appl. No.: 14/255,948

(22) Filed: Apr. 17, 2014

(65) Prior Publication Data

US 2014/0227844 A1 Aug. 14, 2014

Related U.S. Application Data

(62) Division of application No. 13/412,714, filed on Mar. 6, 2012, now abandoned.

(51) Int. Cl.
*H01L 21/8234* (2006.01)
*H01L 21/8238* (2006.01)

(52) U.S. Cl.
CPC .. *H01L 21/82345* (2013.01); *H01L 21/823807* (2013.01); *H01L 21/823835* (2013.01); *H01L 21/823842* (2013.01); *H01L 21/823857* (2013.01)

USPC .......... 438/275; 438/294; 438/199; 438/692; 257/368; 257/E21.409; 257/E21.632

(58) Field of Classification Search
CPC ................................ H01L 21/823835
USPC .................. 438/294, 275, 199, 692; 257/368, 257/E21.409, E21.632
See application file for complete search history.

(56) References Cited

U.S. PATENT DOCUMENTS

| | | | |
|---|---|---|---|
| 6,171,910 B1 * | 1/2001 | Hobbs et al. | 438/275 |
| 6,432,776 B1 * | 8/2002 | Ono | 438/275 |
| 8,093,116 B2 * | 1/2012 | Chung et al. | 438/183 |
| 8,294,216 B2 * | 10/2012 | Chuang et al. | 257/368 |
| 2002/0151125 A1 * | 10/2002 | Kim et al. | 438/199 |
| 2010/0038692 A1 * | 2/2010 | Chuang et al. | 257/298 |
| 2010/0087038 A1 * | 4/2010 | Chung et al. | 438/199 |
| 2010/0087055 A1 * | 4/2010 | Lai et al. | 438/585 |
| 2011/0156154 A1 * | 6/2011 | Hoentschel et al. | 257/369 |

* cited by examiner

*Primary Examiner* — William F Kraig
*Assistant Examiner* — Pavel Ivanov
(74) *Attorney, Agent, or Firm* — Ding Yu Tan (57) ABSTRACT

A method for fabricating an integrated circuit includes the following steps of: providing a substrate with at least one isolation structure formed therein so as to separate the substrate into a first active region with a first stacked structure formed thereon and a second active region with a second stacked structure formed thereon; forming an interlayer dielectric layer covering the first stacked structure and the second stacked structure; and planarizing the interlayer dielectric layer to expose the top surface of the first stacked structure, wherein the second stacked structure is still covered by the interlayer dielectric layer after planarizing.

15 Claims, 9 Drawing Sheets

FIG. 2E

METHOD FOR FABRICATING INTEGRATED CIRCUIT WITH DIFFERENT GATE HEIGHTS AND DIFFERENT MATERIALS

CROSS-REFERENCE TO RELATED APPLICATIONS

This application is a divisional of, and claims the benefit of U.S. nonprovisional application Ser. No. 13/412714, filed Mar. 6, 2012, the disclosure of which is hereby incorporated by reference herein in its entirety.

TECHNICAL FIELD

The present invention relates to a method for fabricating an integrated circuit, more particularly to a method for fabricating an integrated circuit integrating the high-k/metal gate semiconductor device with the poly-silicon semiconductor device.

DESCRIPTION OF THE RELATED ART

As the dimension of a semiconductor device is getting less, the dimension of the gate structure and the thickness of the gate insulation layer are reduced accordingly. However, a leakage current occurs when the gate insulation layer of silicon oxide becomes thinner. To reduce the leakage current, a high dielectric constant (high-k) material is used to replace silicon oxide for forming the gate insulation layer. The gate of polysilicon may react with the high-k material to generate a Fermi-level pinning, so that the threshold voltage is increased and the performance of the device is affected. Therefore, a metal layer is used as a gate, so as to avoid an increase in the threshold voltage and reduce the resistance of the device.

However, for the high voltage device, electrostatic discharge (ESD) device, flash device and non-volatile memory (NVM) device, the gate insulating layer should has specific thickness to avoid from being breakdown by the high operation voltage.

BRIEF SUMMARY

The invention is directed to a method for fabricating an integrated circuit for integrating the high-k/metal gate semiconductor device with the poly-silicon semiconductor device.

The invention provides a method for fabricating an integrated circuit including the following steps. First, a substrate with at least one isolation structure formed therein so as to separate the substrate into a first active region and a second active region is provided. Further, a first stacked structure has been formed on the first active region and a second stacked structure has been formed on the second active region. Next, an interlayer dielectric layer (ILD) is formed and covers the first stacked structure and the second stacked structure. Afterward, the interlayer dielectric layer is planarized to expose the top surface of the first stacked structure. Accordingly, the second stacked structure is still covered by the interlayer dielectric layer after planarizing.

In some embodiments of the present invention, the second stacked structure includes a second gate insulating layer and a dummy gate sequentially formed on the substrate, and after planarizing the interlayer dielectric layer, the dummy gate is removed so as to form an opening and then a metal gate is formed in the opening.

In some embodiments of the present invention, the method for forming the first stacked structure and the second stacked structure includes the following steps. First, a second dielectric material layer is formed on the substrate. Next, a first poly-silicon layer is formed on the second dielectric material layer. Later, a portion of the second dielectric material layer and a portion of the first poly-silicon layer are removed to expose the first active region. Afterward, a first dielectric material layer is formed on the first active region. Then, a second poly-silicon layer is conformally formed on the substrate with a first thickness. Moreover, the second poly-silicon layer constructs a gate material layer with the first poly-silicon. Further, a first portion of the gate material layer is the portion of the second poly-silicon layer located on the first active region and a second portion of the gate material layer with a second thickness greater than the first thickness is constructed from the portion of the first poly-silicon layer remained on the substrate and the portion of the second poly-silicon layer located on the second active region. After that, the gate material layer, the first dielectric material layer and the second dielectric material layer are patterned to form the first stacked structure on the first active region and the second stacked structure on the second active region. Accordingly, the first stacked structure includes a first gate insulating layer and a poly-silicon gate sequentially stacked on the substrate, and the second stacked structure includes a second gate insulating layer and a dummy gate sequentially stacked on the substrate.

In some embodiments of the present invention, the first dielectric material layer has a first dielectric constant and the second dielectric material layer has a second dielectric constant greater than the first dielectric constant.

In some embodiments of the present invention, the method for fabricating the integrated circuit further includes the step of forming a mask layer on the gate material layer conformally before patterning the gate material layer, the first dielectric material layer and the second dielectric material layer. Furthermore, the mask layer is patterned with the gate material layer, the first dielectric material layer and the second dielectric material layer.

In some embodiments of the present invention, before forming the interlayer dielectric layer, the method for fabricating integrated circuit further includes the following steps. First, a portion of the mask layer located on the poly-silicon gate is removed to expose the poly-silicon gate. Then, the poly-silicon gate is doped.

In some embodiments of the present invention, a plurality of first source/drain regions are further formed in the substrate beside the dummy gate and a plurality of second source/drain regions are further formed in the substrate beside the poly-silicon gate while the poly-silicon gate is doped.

In some embodiments of the present invention, a plurality of source/drain metal salicides are further formed in the substrate and on the first source/drain regions and the second source/drain regions.

In some embodiments of the present invention, the method for forming the first stacked structure and the second stacked structure includes the following steps. First, a first dielectric material layer and a gate material layer are formed on the substrate sequentially. Moreover, the first dielectric material layer covers the first active region and the second active region, and the gate material has a first portion with a first thickness located above the first active region and the second portion with a second thickness located above the second active region greater than the first thickness. Then, the gate material layer and the first dielectric material layer are patterned to form the first stacked structure on the first active region and the second stacked structure on the second active region. Moreover, the first stacked structure includes a first gate insulating layer and a poly-silicon gate sequentially stacked on the substrate, and the second stacked structure includes a patterning first dielectric material layer and a dummy gate sequentially stacked on the substrate.

In some embodiments of the present invention, after planarizing the interlayer dielectric layer, the dummy gate is removed to form an opening exposing the patterning first dielectric material layer and then the patterning first dielectric material layer is also removed. Afterward, a second gate insulating layer and a metal gate are formed in the opening sequentially.

In some embodiments of the present invention, the first dielectric material layer has a first dielectric constant and the second gate insulating layer has a second dielectric constant greater than the first dielectric constant.

In some embodiments of the present invention, the method of forming the gate material layer includes the following steps. First, a poly-silicon layer with the second thickness is formed on the first dielectric material layer. Then, a portion of the poly-silicon layer located on the first active region is thinned to the first thickness.

In some embodiments of the present invention, before forming the interlayer dielectric layer, a first spacer is further formed on the sidewalls of the first stacked structure and a second spacer is further formed on the sidewalls of the second stacked structure.

In some embodiments of the present invention, before forming the interlayer dielectric layer, a plurality of first source/drain regions are further formed in the substrate beside the first spacer and a plurality of second source/drain regions are further formed in the substrate beside the second spacer.

In some embodiments of the present invention, a metal silicides pattern is further formed on the poly-silicon gate.

The integrated circuit for integrating the high-k/metal gate semiconductor device with the poly-silicon semiconductor device which have different heights fabricated by the method of the present invention, is fabricated with simpler process, therefore the process cost and the consuming time can be decreased.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Hereinafter, preferred embodiments of the present invention will be described in detail with reference to the accompanying drawings. Here, it is to be noted that the present invention is not limited thereto. Furthermore, the step serial numbers concerning the saturation adjustment method are not meant thereto limit the operating sequence, and any rearrangement of the operating sequence for achieving same functionality is still within the spirit and scope of the invention. The like numbered numerals designate similar or the same parts, regions or elements. It is to be understood that the drawings are not drawn to scale and are served only for illustration purposes.

FIGS. 1A-1K illustrate cross-section views of an integrated circuit during a fabricating process thereof according to a first embodiment of the present invention. Referring to FIGS. 1A-1E, a substrate 102, such as a silicon substrate, a silicon-containing substrate, or a silicon-on-insulator (SOI) substrate, with a plurality of isolation structures 101 formed therein is provided. Moreover, a first active region 103 and a second active region of the substrate 102 are defined by the isolation structures 101. Accordingly, one of the isolation structures 101 is located between the first active region 103 and the second active region 105. In this embodiment, the isolation structures 101 are, for example, shallow trench isolation (STI) structures or filed oxide isolation structures.

Figure 1A:
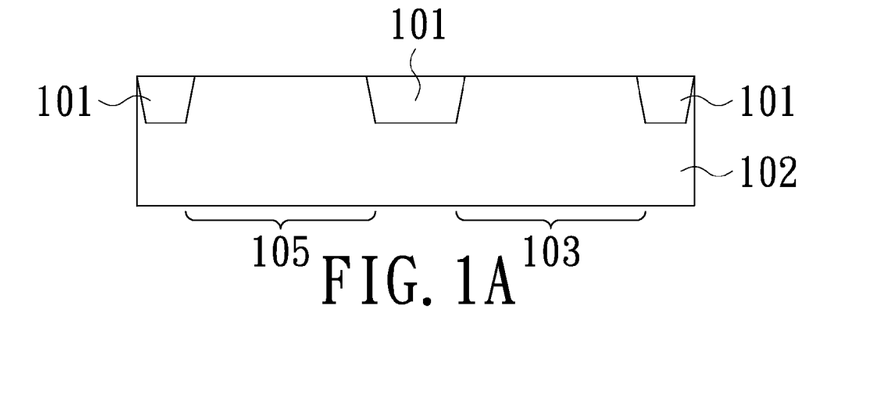
FIGS. 1A-1K illustrate cross-section views of an integrated circuit during a fabricating process thereof according to a first embodiment of the present invention.
Figure 1B:
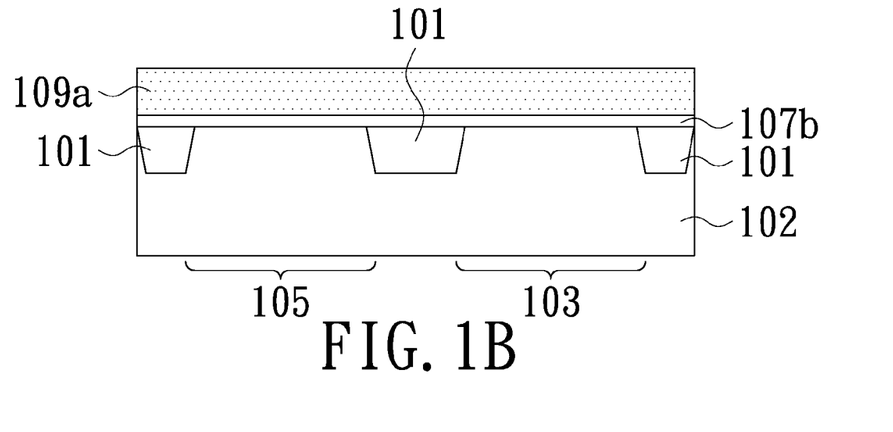
Figure 1C:
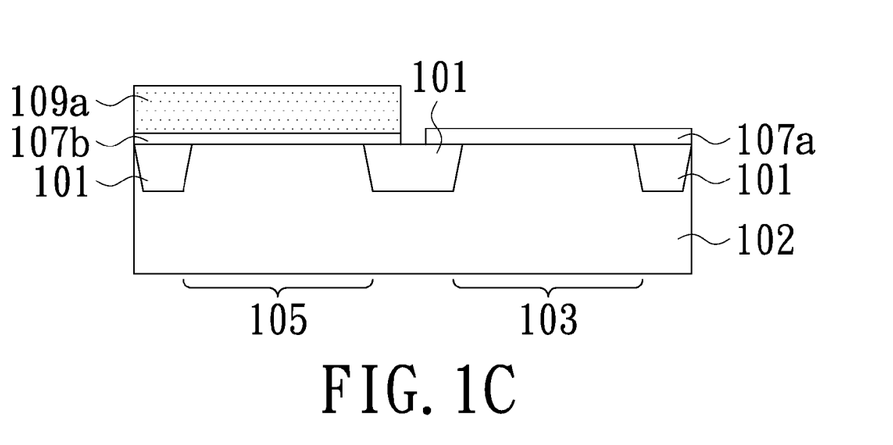
Figure 1D:
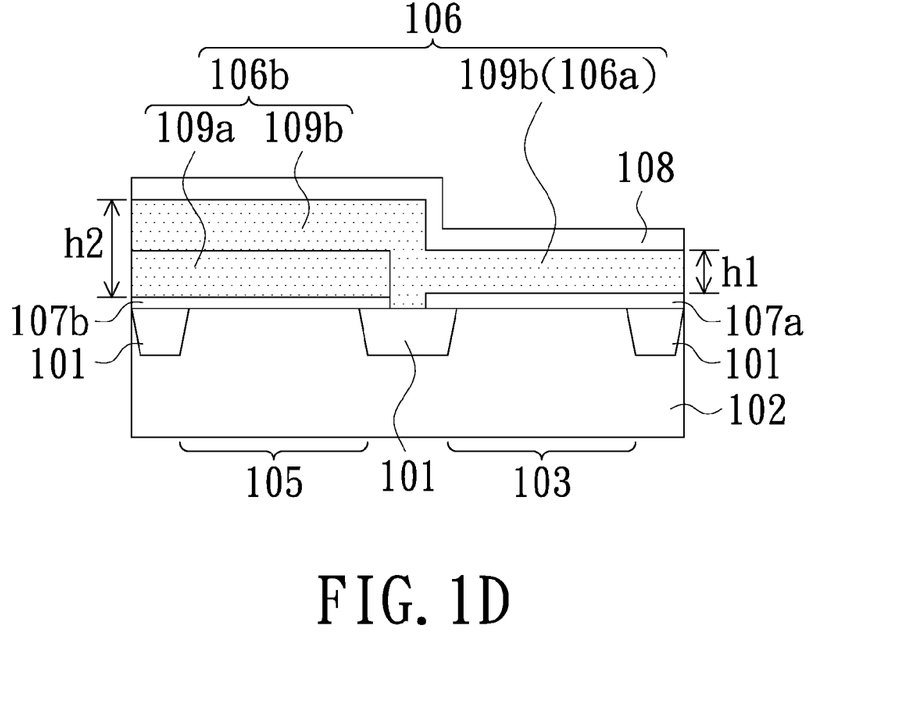
Figure 1E:
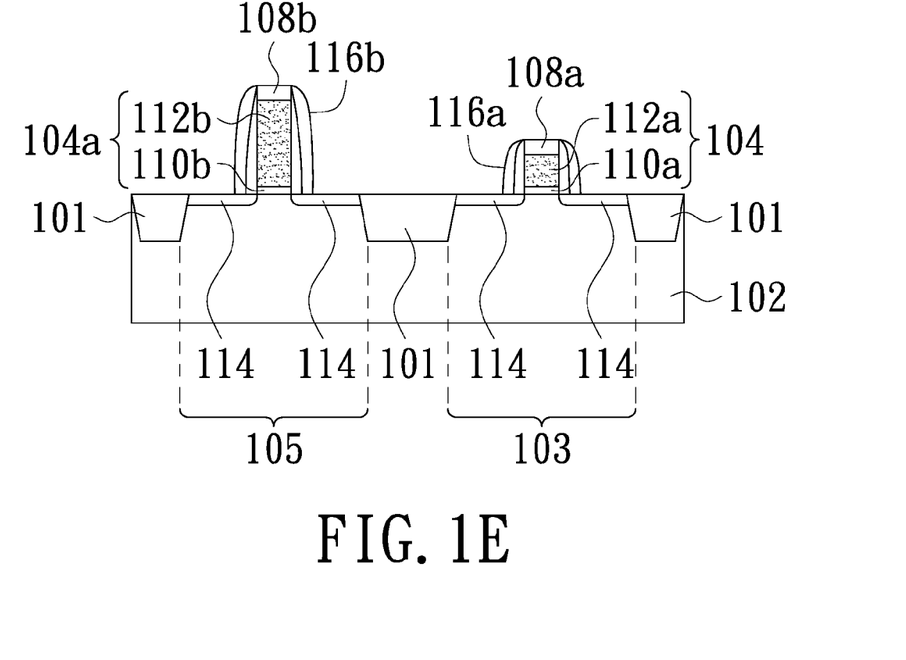

As shown in FIG. 1E, a first stacked structure 104 has been foamed on the first active region 103 of the substrate 102 and a second stacked structure 104a has been formed on the second active region 105. The first stacked structure 104 includes a first gate insulating layer 110a and a poly-silicon gate 112a stacked on the substrate 102 sequentially. The second stacked structure 104a includes a second gate insulating layer 110b and a dummy gate 112b stacked on the substrate 102 sequentially.

In detail, as shown in FIG. 1B, the method of forming the first stacked structure 104 and the second stacked structure 104a includes the following steps. Firstly, a second dielectric material layer 107b and a first poly-silicon layer 109a are sequentially formed on the substrate 102. In this embodiment, the second dielectric material layer 107b has a second dielectric constant, which may be greater than 4. The materials of the second dielectric material layer 107b may include hafnium dioxide ($HfO_2$), zirconium dioxide ($ZrO_2$), aluminum oxide ($Al_2O_3$), aluminum nitride (AlN), titanium dioxide ($TiO_2$), lanthanum oxide ($La_2O_3$), yttrium oxide ($Y_2O_3$), gadolinium oxide ($Gd_2O_3$), tantalum pentoxide ($Ta2O_5$) or a combination thereof, for example. The method of forming the second dielectric material layer 107b includes performing a chemical vapor deposition (CVD) process, for example. Further, according to an embodiment of the present invention, the second dielectric material layer 107b can be a single dielectric layer or a structure including multiple dielectric layers, but the invention is not limited hereto.

Referring to FIG. 1C, a portion of the first poly-silicon layer 109a and a portion of the second dielectric material layer 107b disposed on the first active region 103 are removed to expose the first active region 103 of the substrate 102. Then, a first dielectric material layer 107a is formed on the first active region 103. Moreover, the first dielectric material layer 107a has a first dielectric constant less than the second dielectric constant.

In this embodiment, a conformal dielectric material layer (not shown) is formed on the substrate 102 at first, and then the portions of the dielectric material layer located out of the first active region 103 are removed so as to remain the first dielectric material layer 107a on the first active region 103. Furthermore, in other embodiment, the portions of the dielectric material layer located out of the first active region 103 may be removed with other layers in later processes.

Referring to FIG. 1D, a second poly-silicon layer 109b having a first thickness h1 is conformally formed on the substrate 102 to construct the gate material layer 106 with the first poly-silicon layer 109a. In detail, the portion of the second poly-silicon layer 109b disposed above the first active region 103 is used as the first portion 106a of the gate material layer 106. The remained portion of the first poly-silicon layer 109a is stacked by a portion of the second poly-silicon layer 109b disposed above the second active region 105 to construct the second portion 106b of the gate material layer 106 with a second thickness h2 greater than the first thickness h1. In this embodiment, the second thickness h2 is about 500 angstroms and the difference between that and the first thickness h1 is about 100 to 150 angstroms, but the invention is not limited hereto.

Further, a mask layer 108 may be optionally and conformally formed on the gate material layer 106 in this embodiment. The hard mask layer 108 includes a material having an etching selectivity high enough with respect to the gate material layer 106, such as silicon nitride or silicon oxynitride (SiON). The method of forming the hard mask layer 108 includes performing a chemical vapor deposition process or a physical vapor deposition process, for example.

Referring to FIG. 1E, the first dielectric material layer 107a, the second dielectric material layer 107b and the gate material layer 106 are patterned to form a first stacked structure 104 on the first active region 103 and form a second stacked structure 104a on the second active region 105. Moreover, before patterning the first dielectric material layer 107a, the second dielectric material layer 107b and the gate material layer 106, the mask layer 108 may be patterned to respectively form a mask pattern 108a and a mask pattern 108b above the first active region 103 and the second active region 105. After that, the first dielectric material layer 107a, the second dielectric material layer 107b and the gate material layer 106 are patterned by using the same photo mask (not shown). In this embodiment, the patterning process includes performing general lithography and etching processes, for example.

After the patterning process is completed, lightly doped regions 114 may be formed in the substrate 102 beside the first stacked structure 104 in the first active region 103 and the second stacked structure 104a in the second active region 105 according to an embodiment. When the first active region 103 is for forming an NMOS transistor, the lightly doped regions 114 in the first active region 103 are N-type lightly doped regions. When the first active region 103 is for forming a PMOS transistor, the lightly doped regions 114 in the first active region 103 are P-type lightly doped regions.

According to another embodiment, after forming the lightly doped regions 114, a first spacer 116a may be optionally formed on sidewalls of the first stacked structure 104 and a second spacer 116b may be optionally formed on sidewalls of the second stacked structure 104a.

In details, the first spacer 116a is formed on the sidewalls of the mask pattern 108a, the poly-silicon gate 112a and the first gate dielectric layer 110a. The second spacer 116b is formed on the sidewalls of the mask pattern 108b, the dummy gate 112b and the second gate dielectric layer 110b. The first spacer 116a and the second spacer 116b include silicon oxide, silicon nitride or silicon oxynitride (SiON), for example. The method of forming the first spacer 116a and the second spacer 116b includes forming a spacer material layer (not shown) on the substrate 102 by a CVD process, and then removing a portion of the spacer material layer by an anisotropic etching process. Each of the first spacer 116a and second spacer 116b can be a single layer or a multi-layer structure, and only a single layer is shown in FIG. 1E. The present invention does not limit to this embodiment. According to another embodiment, the first spacer 116a and the second spacer 116b are not formed.

Figure 1F:
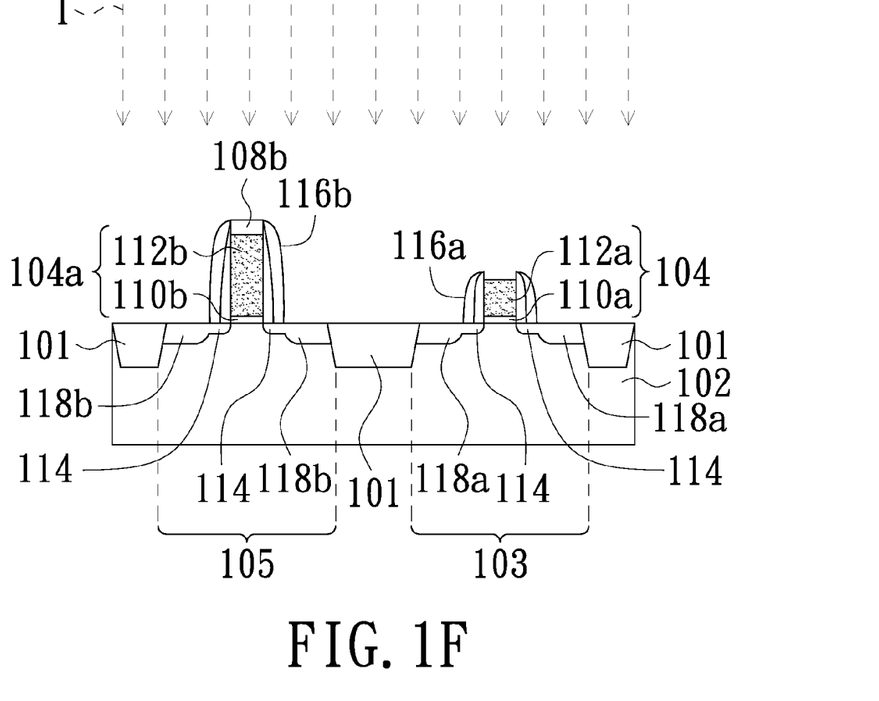

Thereafter, as shown in FIG. 1F, first source/drain regions 118a are formed in the substrate 102 beside the first stacked structure 104, and second source/drain regions 118b are formed in the substrate 102 beside the second stacked structure 104a. In an embodiment, the method of forming the first source/drain regions 118a and the second source/drain regions 118b includes performing an ion implantation process, for example. When the first active region 103 is for forming an NMOS transistor, the first source/drain regions 118a are N-type heavily doped regions. When the first active region 103 is for forming a PMOS transistor, the first source/drain regions 118a are P-type heavily doped regions. Moreover, the mask pattern 108b formed on the poly-silicon gate 112a is removed before forming the first source/drain regions 118a and the second source/drain regions in this embodiment, so that the poly-silicon gate 112a can be doped during the ion implantation process of the first source/drain regions 118a and the second source/drain regions, but the invention is not limited hereto.

Figure 1G:
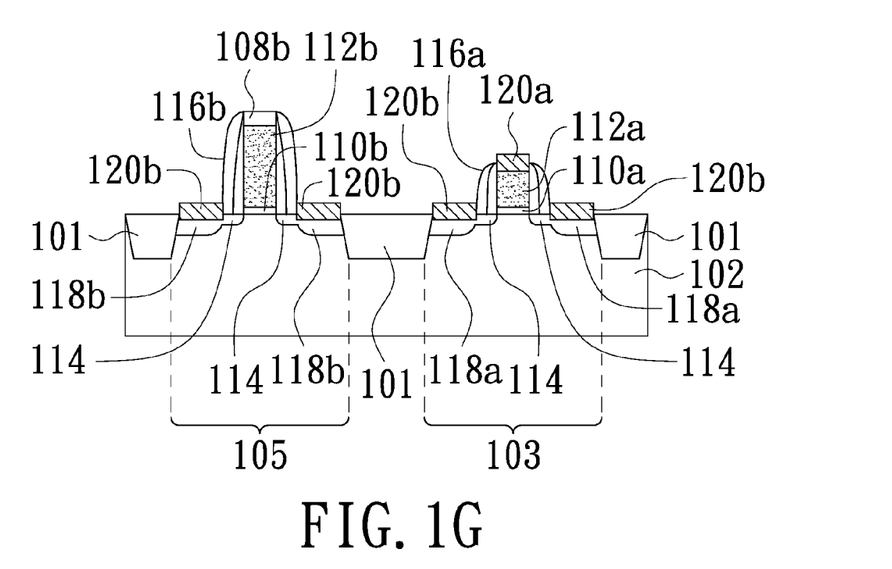

Referring to FIG. 1G, according to a preferred embodiment of the present invention, the method further includes forming a metal salicide pattern 120a on the poly-silicon gate 112a, and forming a plurality of source/drain metal salicides 120b on the surface of the substrate 102 beside the dummy gate 112b and the poly-silicon gate 112a. The source/drain metal salicides 120b are formed on the surface of the first source/drain regions 118a and the second source/drain regions 118b which are previously formed. The method of forming the metal salicide pattern 120a and the source/drain metal salicides 120b includes forming a metal layer (not shown) on the substrate 102. Thereafter, an annealing process is performed, so that metal salicidation occurs between the metal layer and the poly-silicon gate 112a and between the metal layer and the first source/drain regions 118a and the second source/drain regions 118b, and thus, the metal salicide pattern 120a is formed on the surface of the poly-silicon gate 112a, and the source/drain metal salicides 120b are formed on the surface of the first source/drain regions 118a and the second source/drain regions 118b. Afterwards, the unreacted metal layer is removed. The metal salicide pattern 120a and the source/drain metal salicides 120b include TiSi, CoSi, NiSi, PtSi, WSi, TaSi, MoSi or a combination thereof.

Figure 1H:
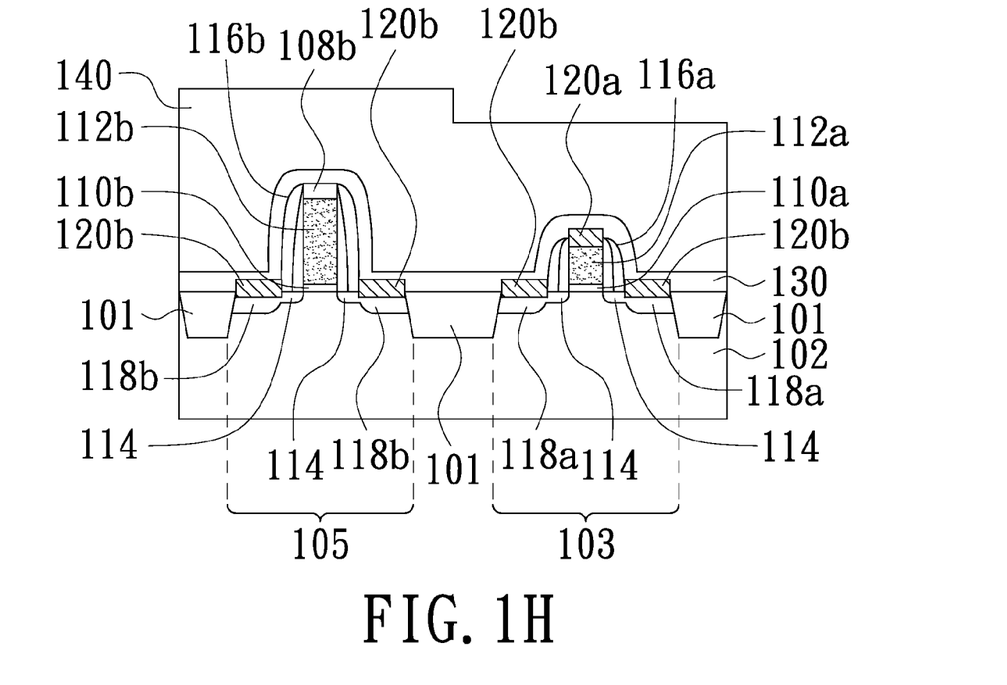

Referring to FIG. 1H, according to a preferred embodiment of the present invention, the method further includes optionally forming a protection layer 130 on the substrate 102, so as to cover the formed structures in the first active region 103 and the second active region 105. The protection layer 130 includes silicon nitride or silicon oxynitride (SiON), and the forming method thereof includes performing a CVD or PVD process, for example. The protection layer 130 conformally covers the surface of the formed structures on the substrate 102 and selectively applies tension stress or compress stress on the NMOS transistor or PMONS transistor. Thereafter, an ILD layer 140 is formed on the protection layer 130. The ILD layer 140 includes SiO, SiN, SiON or a combination thereof, and the forming method thereof includes performing a CVD process, for example.

Figure 1I:
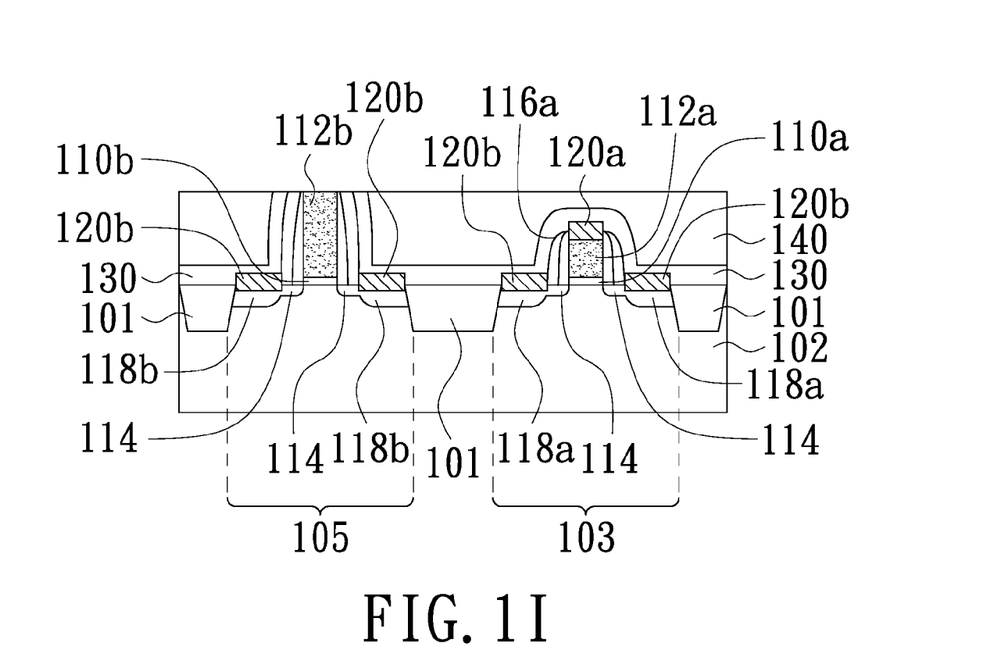

Referring to FIG. 1I, a planarization process is performed, so as to remove a portion of the interlayer dielectric layer 140 and the protection layer 130 until the surface of the dummy gate 112b is exposed. Since there is a height difference exist between the poly-silicon gate 112a and the dummy gate 112b, after the step of performing the planarization process in FIG. 1I, the surface of the dummy gate 112b is exposed while the poly-silicon gate 112a (and the metal salicide layer 120a) is not exposed and still covered by the protection layer 130 and the interlayer dielectric layer 140. In this embodiment, the planarization process is a chemical mechanical polishing (CMP) process, for example.

Figure 1J:
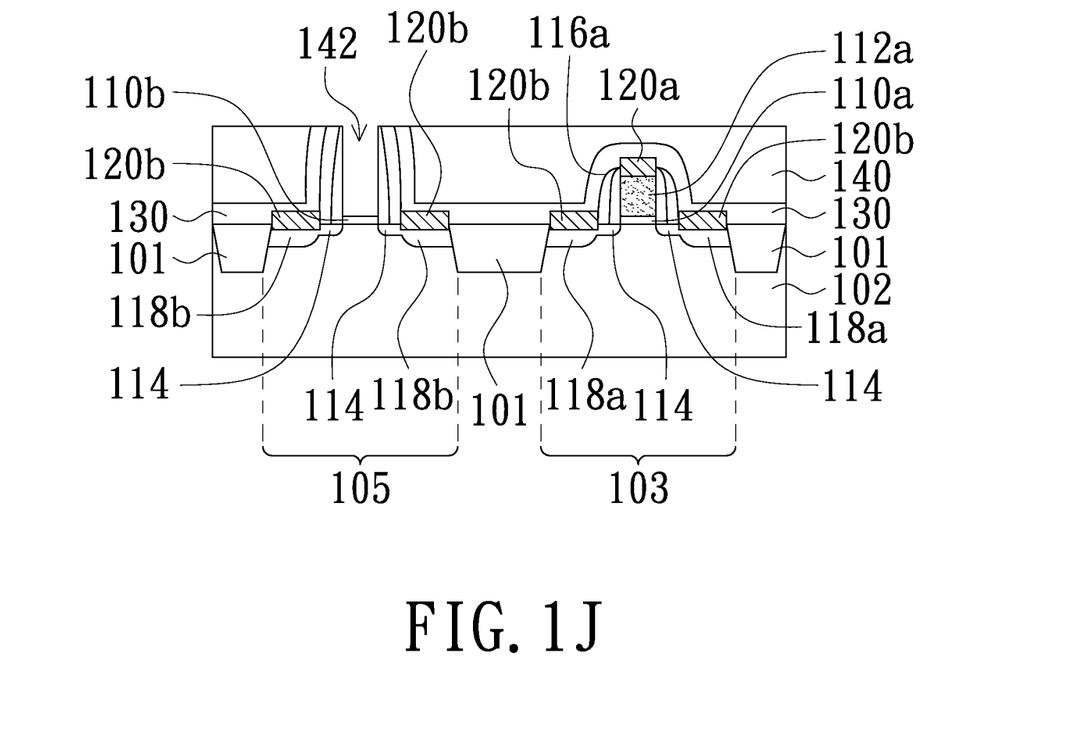

Thereafter, the exposed dummy gate 112b is removed to form an opening 142, as shown in FIG. 1J. The method of removing the dummy gate 112b includes performing an etching process, for example. The poly-silicon gate 112a is unexposed and covered by the protection layer 130 and the interlayer dielectric layer 140, so that removal or peeling of the poly-silicon gate 112a is not observed.

Figure 1K:
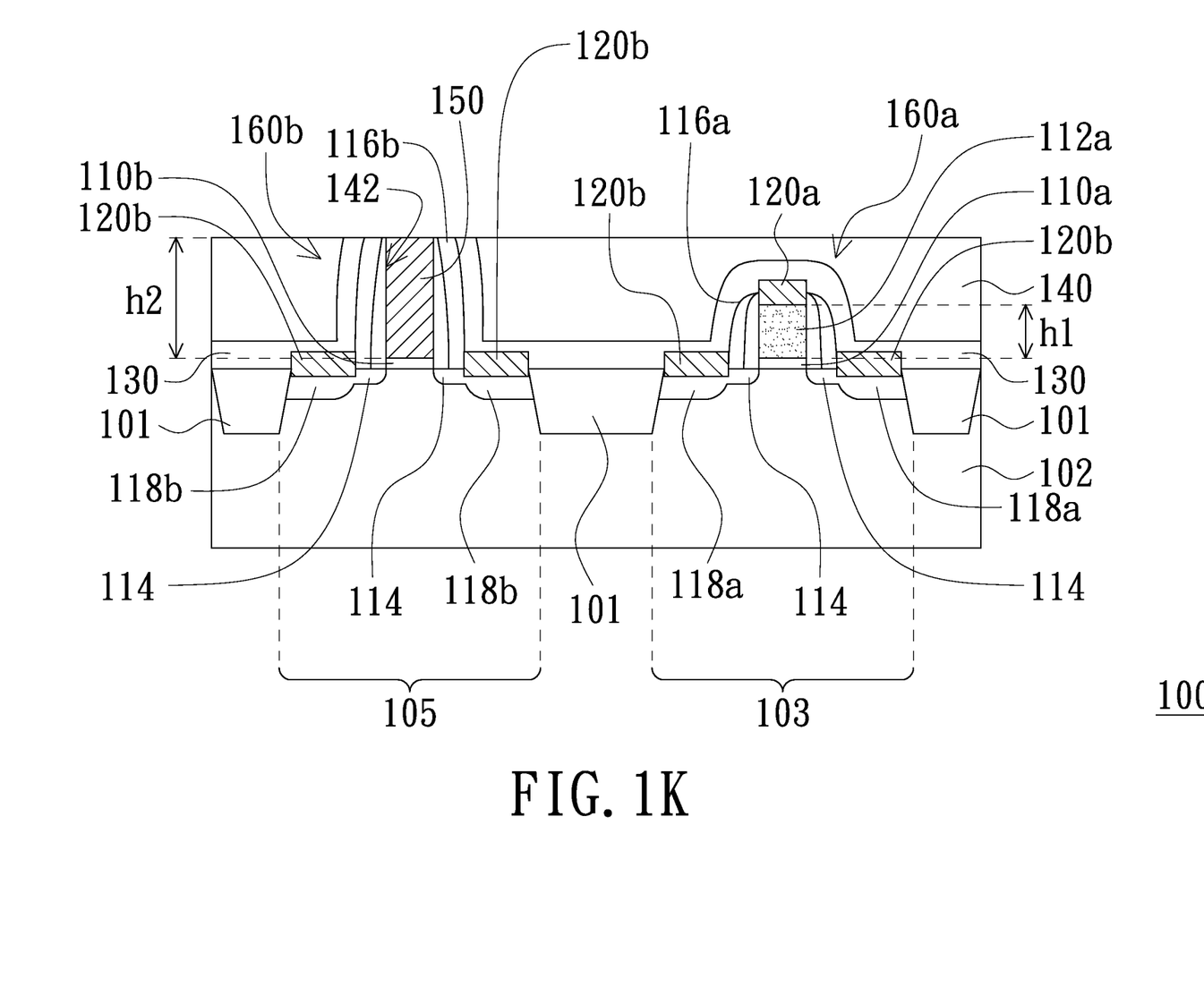

Referring to FIG. 1K, a metal gate 150 is formed in the opening 142, therefore an integrated circuit 100 is substantially completed. The metal gate 150 includes work function metal and/or low-resistance metal and the material thereof is, for example, Ti, TiAl$_x$, Ti rich TiN, Al or a combination thereof, for example. The method of forming the metal gate 150 includes forming a metal material layer (not shown) to cover the interlayer dielectric layer 140 and fill up the opening 142. Thereafter, a CMP process or an etching back process is performed, so as to remove a portion of the metal material layer outside the opening 142. Thus, a first semiconductor device 160a and a second semiconductor device 160b are formed on the substrate 102. Specifically, the first semiconductor device 160a is a transistor or memory device having the poly-silicon gate 112a, and the second semiconductor device 160b is a MOS transistor having the metal gate 150.

After that, a plurality of interconnect layers may be formed on the structure of FIG. 1K to cover the metal gate 150 and the interlayer dielectric layer 140. The plurality of interconnect layers are usually comprised of a plurality of interlayer dielectric layers and a plurality of interconnect structures in the interlayer dielectric layers.

As shown in FIG. 1K, the integrated circuit 100 formed by the above-mentioned method includes a substrate 102, a first semiconductor device 160a, a second semiconductor device 160b and an interlayer dielectric layer 140. According to a preferred embodiment, a plurality of isolation structures 101 have been formed in the substrate 102 of the integrated circuit 100 so as to separate the substrate 102 to a first active region 103 and a second active region 105.

The first semiconductor device 160a is disposed on the first active region 103 of the substrate 102 and includes a first gate dielectric layer 110a and a poly-silicon gate 112a. Preferably, the first semiconductor device 160a further includes a first spacer 116a. In details, the first gate dielectric layer 110a is disposed on the substrate 100 and has a first dielectric constant. The poly-silicon gate 112a is disposed on the first gate dielectric layer 110a and has a first thickness h1. The first spacer 116a is disposed on the sidewall of the poly-silicon gate 112a.

The first semiconductor device 160a further includes the light doped drain regions 114, the first source/drain regions 118a and the source/drain silicides 120b. Moreover, the first semiconductor device 160a also can include a metal salicide pattern 120a. The light doped drain regions 114 are disposed in the substrate 102 beside the metal gate 150. The first source/drain regions 118a are disposed in the substrate 102 beside the first spacers 116a. The lightly doped regions 114 and the first source/drain 118a can be N-type or P-type doped regions depending on the conductivity type of the first semiconductor device 160a. The source/drain metal salicides 120b are disposed on the surface of the first source/drain regions 118a, and the metal salicide pattern 120a is disposed on the poly-silicon gate 112a.

The second semiconductor device 160b is disposed on the second active region 105 of the substrate 102. The second semiconductor device 160b includes a second gate dielectric layer 110b and a metal gate 150, and preferably the second semiconductor device 160b further includes a second spacer 116b. In details, the second gate dielectric layer 110b is disposed on the substrate 102. The metal gate 150 is disposed on the second gate dielectric layer 110b with a second thickness h2 greater than the first thickness h1 of the poly-silicon gate 112a. According to a preferred embodiment of the present invention, the thickness difference between the metal gate 150 of the second semiconductor device 160b and the poly-silicon gate 112a of the first semiconductor device 160a is about 100 to 150 angstroms. In other words, the difference between the top surface of the metal gate 150 and that of the poly-silicon gate 112a is about 100 to 150 angstroms. The second spacer 116b is disposed on the sidewall of the metal gate 150.

The second semiconductor device 160b further includes the light doped drain regions 114 and the second source/drain regions 118b. The light doped drain regions 114 are disposed in the substrate 102 beside the metal gate 150. The second source/drain regions 118b are disposed in the substrate 102 beside the second spacers 116b. The lightly doped regions 114 and the second source/drain 118b can be N-type or P-type doped regions depending on the conductivity type of the second semiconductor device 160b. The source/drain metal salicides 120b are disposed on the surface of the second source/drain regions 118b.

The interlayer dielectric layer 140 covers the first semiconductor device 160a but exposes the metal gate 150 of the second semiconductor device 160b. Further, the integrated circuit 100 further includes the protection layer 130 covers the first semiconductor device 160a and is disposed between the interlayer dielectric layer 140 and the first semiconductor device 160a. Specifically, the protection layer 130 covers the second spacer 116b of the second semiconductor device 160b but exposes the metal gate 150 of the second semiconductor device 160b.

According to an embodiment, a plurality of interconnect layers may be disposed on the structure of FIG. 1K to cover the metal gate 150 and the interlayer dielectric layer 140. The plurality of interconnect layers are usually comprised of a plurality of interlayer dielectric layers and a plurality of interconnect structures in the interlayer dielectric layers.

Accordingly, the second semiconductor device 160b is a high-k/metal gate transistor. Further, the second gate dielectric layer 110 with high dielectric constant is formed on the substrate 102 before removing dummy gate 112b, but the invention is not limited hereto. In other embodiment, the second gate dielectric layer 110b and the metal gate 150 of the second semiconductor device 160b can be formed after removing the dummy gate 112b. The details would be described in the following embodiment.

Figure 2A:
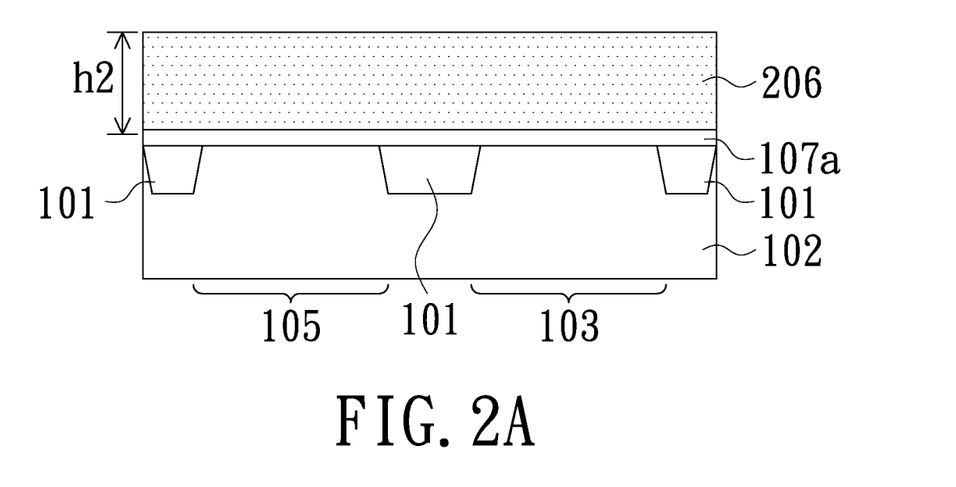
FIGS. 2A-2E illustrate cross-section views of an integrated circuit during a fabricating process thereof according to a second embodiment of the present invention.

FIGS. 2A-2E illustrate cross-section views of an integrated circuit during the fabricating process thereof according to a second embodiment of the present invention. Referring to FIG. 2A, in this embodiment, the method of forming the gate material layer includes, for example, forming a first dielectric material layer 107a and a poly-silicon layer 206 sequentially on the substrate 102 to cover the first active region 103 and the second active region 105. The poly-silicon layer 206 has the second thickness h2. The first dielectric material layer 107a may be, for example, at least one of oxide layer and nitride layer.

Figure 2B:
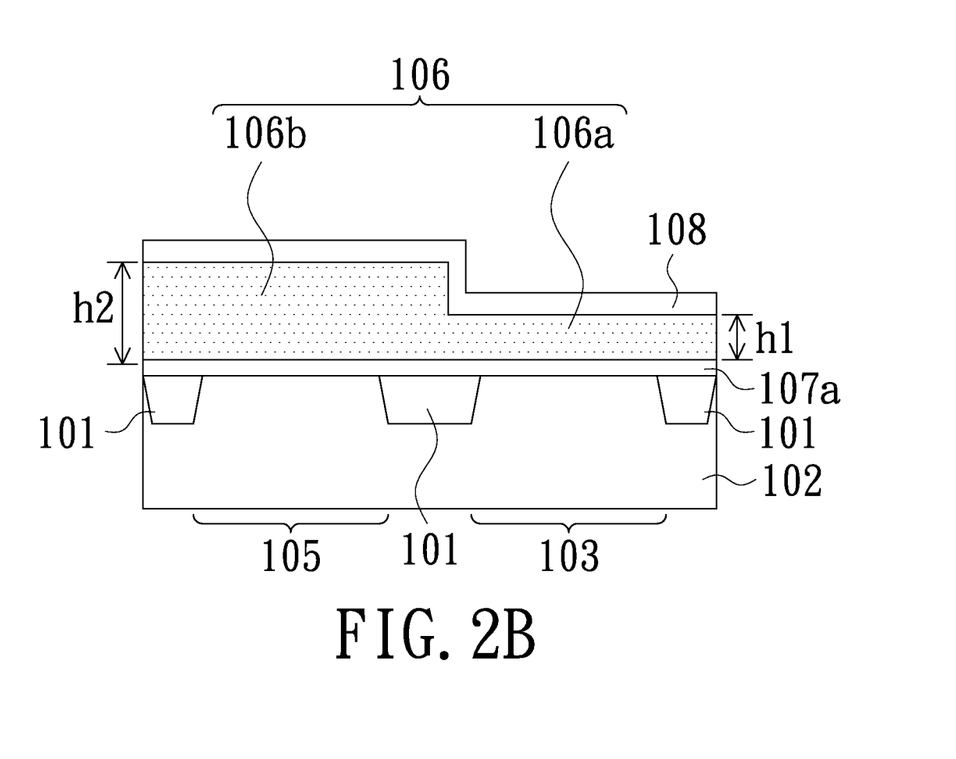

Referring to FIG. 2B, a portion of the poly-silicon layer 206 is removed for thinning the portion of the poly-silicon layer 206 located above the first active region 103 to the first thickness h1. Therefore, the gate material layer 106 having a first portion 106a and the second portion 106b is formed. Then, a mask layer 108 is optional formed on the gate material layer 106.

Figure 2C:
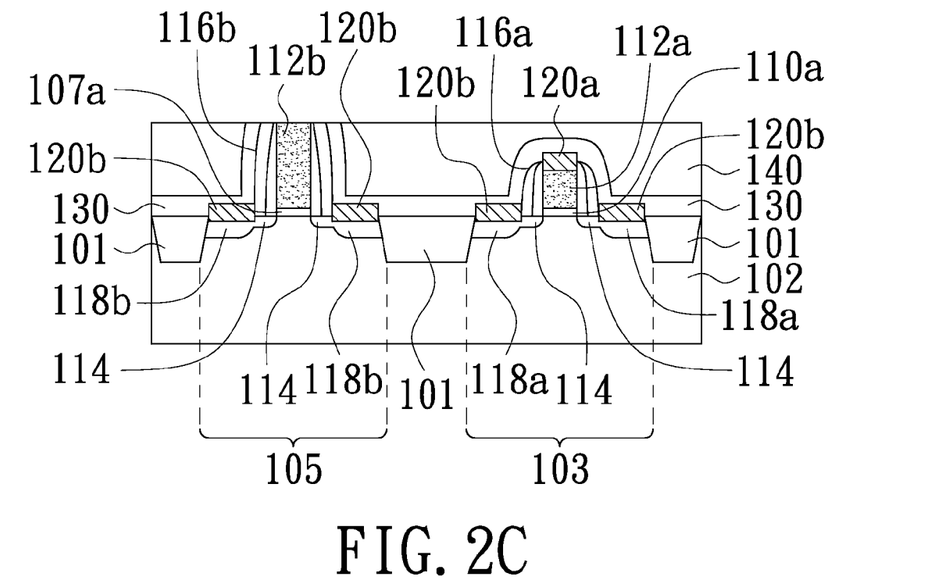
Figure 2D:
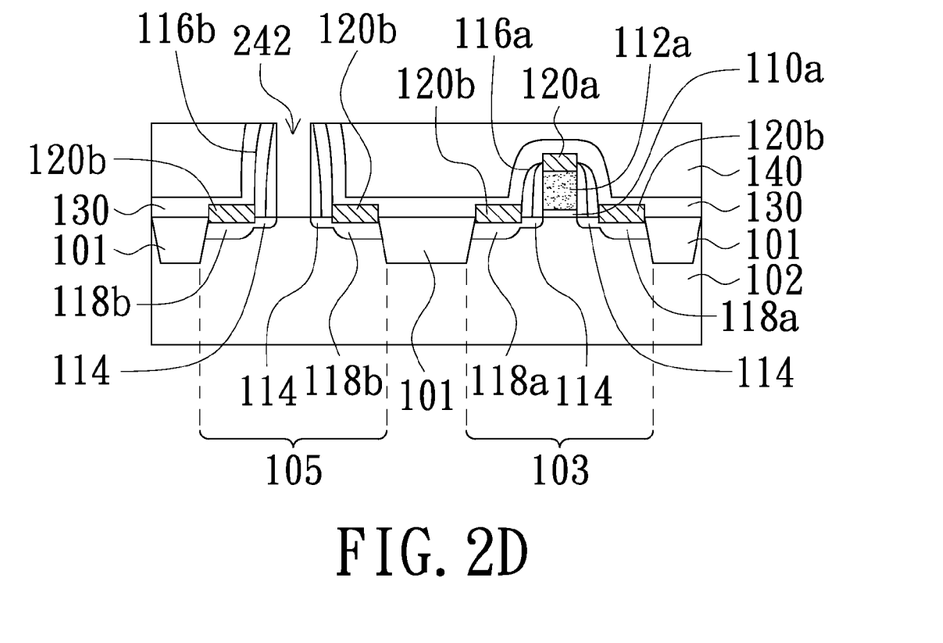

After that, the processes described in the FIG. 1E to FIG. 1I are performed to form the structure shown in FIG. 2C. Then, as shown in FIG. 2D, the dummy gate 112b is removed by using the first dielectric material layer 107a as an etching stop layer. The first dielectric material layer 107a is removed after removing the dummy gate 112b to form an opening 242 exposing a portion of the substrate 102.

Figure 2E:
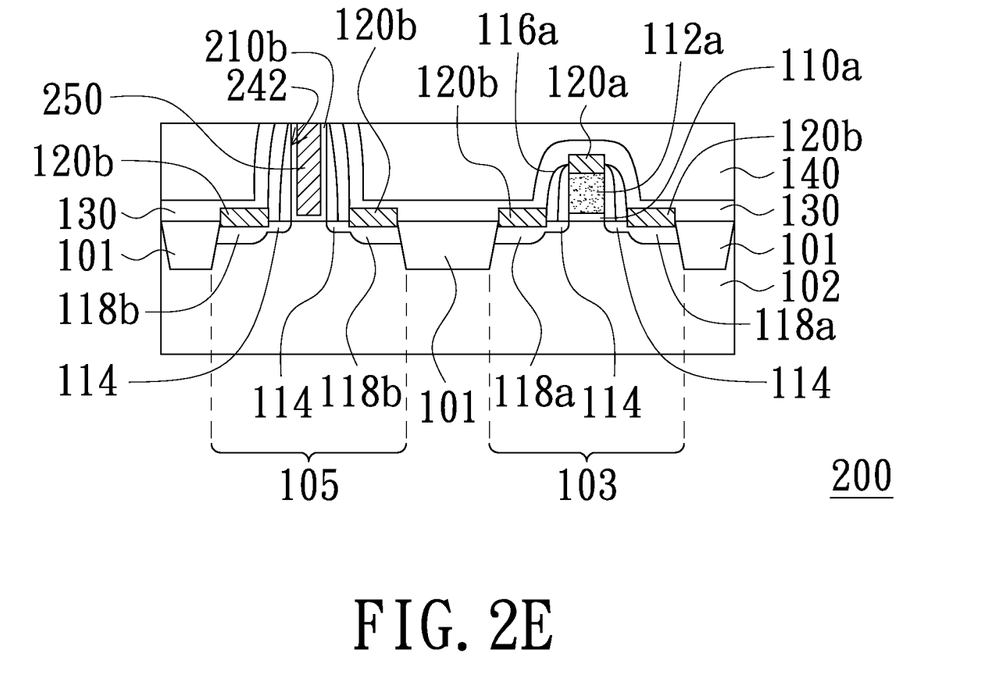

Referring to FIG. 2E, a high-k dielectric layer is formed in the opening 242 to as a second gate dielectric layer 210b. Specifically, the second gate dielectric layer 210 covers the bottom and the sidewalls of the opening 242. Last, the metal gate 250 is formed in the opening 242. Therefore, the integrated circuit 200 is substantially completed. After that, a plurality of interconnect layers may be formed on the structure of FIG. 2E to cover the metal gate 150 and the interlayer dielectric layer 140. The plurality of interconnect layers are usually comprised of a plurality of interlayer dielectric layers and a plurality of interconnect structures in the interlayer dielectric layers.

Referring to FIG. 1K and FIG. 2E, the integrated circuit 200 of the second embodiment is similar to the integrated circuit 100 of the first embodiment except for the presence of the second gate dielectric layer 210b. In detail, the second gate dielectric layer 210b of the integrated circuit 200 covers the bottom and sidewalls of the opening 242. The second gate dielectric layer 110b of the integrated circuit 100 is disposed on the bottom of the opening 142.

In summary, the fabricating process of the high-k/metal gate semiconductor device is integrated with the fabricating process of the poly-silicon semiconductor device in the embodiments of the invention, therefore an integrated circuit having at least two different semiconductor devices can be fabricated to increase the flexible of use of the integrated circuit. Furthermore, the method of the invention can simplify the process of forming two gates with different heights, so that the process cost and the consuming time can be decreased.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for fabricating an integrated circuit, comprising the steps of:
   providing a substrate with at least one isolation structure formed therein so as to separate the substrate into a first active region with a first stacked structure formed thereon and a second active region with a second stacked structure formed thereon;
   forming an interlayer dielectric layer covering the first stacked structure and the second stacked structure; and
   planarizing the interlayer dielectric layer to expose the top surface of the second stacked structure,
   wherein the first stacked structure is still covered by the interlayer dielectric layer after planarizing,
   wherein the method for forming the first stacked structure and the second stacked structure includes the steps of:
      forming a second dielectric material layer on the substrate;
      forming a first poly-silicon layer on the second dielectric material layer;
      removing a portion of the second dielectric material layer and a portion of the first poly-silicon layer to expose the first active region;
      forming a first dielectric material layer on the first active region;
      forming a second poly-silicon layer conformally on the substrate, wherein the second poly-silicon layer has a first thickness and constructs a gate material layer with the first poly-silicon, a first portion of the gate material layer is the portion of the second poly-silicon layer located on the first active region and a second portion of the gate material layer is constructed from the portion of the first poly-silicon layer remained on the substrate and the portion of the second poly-silicon layer located on the second active region, the second portion of the gate material layer has a second thickness greater than the first thickness.

2. The method for fabricating the integrated circuit according to claim 1, wherein the second stacked structure comprises a second gate insulating layer and a dummy gate sequentially formed on the substrate, and after planarizing the interlayer dielectric layer, the method further comprises the steps of:
   removing the dummy gate so as to form an opening; and
   forming a metal gate in the opening.

3. The method for fabricating the integrated circuit according to claim 1, wherein the method for forming the first stacked structure and the second stacked structure further comprises the steps of:
   patterning the gate material layer, the first dielectric material layer and the second dielectric material layer to form the first stacked structure on the first active region and the second stacked structure on the second active region, wherein the first stacked structure comprises a first gate insulating layer and a poly-silicon gate sequentially stacked on the substrate, and the second stacked structure comprises a second gate insulating layer and a dummy gate sequentially stacked on the substrate.

4. The method for fabricating the integrated circuit according to claim 3, wherein the first dielectric material layer has a first dielectric constant and the second dielectric material layer has a second dielectric constant greater than the first dielectric constant.

5. The method for fabricating the integrated circuit according to claim 3, further comprising the step of forming a mask layer on the gate material layer conformally before patterning the gate material layer, the first dielectric material layer and the second dielectric material layer, wherein the mask layer is patterned with the gate material layer, the first dielectric material layer and the second dielectric material layer.

6. The method for fabricating the integrated circuit according to claim 5, wherein before forming the interlayer dielectric layer, further comprising the steps of:
   removing a portion of the mask layer to expose the poly-silicon gate; and
   doping the poly-silicon gate.

7. The method for fabricating the integrated circuit according to claim 6, further comprising the step of forming a plurality of first source/drain regions in the substrate beside the dummy gate and a plurality of second source/drain regions in the substrate beside the poly-silicon gate while doping the poly-silicon gate.

8. The method for fabricating the integrated circuit according to claim 7, further comprising the step of forming a plurality of source/drain metal silicides in the substrate and on the first source/drain regions and the second source/drain regions.

9. The method for fabricating the integrated circuit according to claim 1, wherein the method for forming the first stacked structure and the second stacked structure comprises the steps of:
  forming a first dielectric material layer and a gate material layer on the substrate sequentially, wherein the first dielectric material layer covers the first active region and the second active region, the gate material layer has a first portion with a first thickness located above the first active region and the second portion with a second thickness located above the second active region greater than the first thickness; and
  patterning the gate material layer and the first dielectric material layer to form the first stacked structure on the first active region and the second stacked structure on the second active region, wherein the first stacked structure comprises a first gate insulating layer and a poly-silicon gate sequentially stacked on the substrate, and the second stacked structure comprises a patterned first dielectric material layer and a dummy gate sequentially stacked on the substrate.

10. The method for fabricating the integrated circuit according to claim 9, wherein after planarizing the interlayer dielectric layer, the method further comprises the steps of:
  removing the dummy gate so as to form an opening exposing the patterning first dielectric material layer;
  removing the patterned first dielectric material layer;
  forming a second gate insulating layer in the opening; and
  forming a metal gate in the opening.

11. The method for fabricating the integrated circuit according to claim 10, wherein the first dielectric material layer has a first dielectric constant and the second gate insulating layer has a second dielectric constant greater than the first dielectric constant.

12. The method for fabricating the integrated circuit according to claim 11, wherein the method of forming the gate material layer comprises the steps of:
  forming a poly-silicon layer with the second thickness on the first dielectric material layer; and
  thinning a portion of the poly-silicon layer located on the first active region to the first thickness.

13. The method for fabricating the integrated circuit according to claim 1, further comprises the step of forming a first spacer on the sidewalls of the first stacked structure and a second spacer on the sidewalls of the second stacked structure before forming the interlayer dielectric layer.

14. The method for fabricating the integrated circuit according to claim 13, further comprises the step of forming a plurality of first source/drain regions in the substrate beside the first spacers and a plurality of second source/drain regions in the substrate beside the second spacers before forming the interlayer dielectric layer.

15. The method for fabricating the integrated circuit according to claim 1, further comprising the step of forming a metal silicides pattern on the poly-silicon gate.

* * * * *